United States Patent [19]

Slob

[11] Patent Number: 4,878,202

[45] Date of Patent: Oct. 31, 1989

[54] CHARGE-COUPLED DEVICE

[75] Inventor: Arie Slob, Eindhoven, Netherlands

[73] Assignee: U.S. Philips Corporation, New York, N.Y.

[21] Appl. No.: 187,612

[22] Filed: Apr. 28, 1988

[30] Foreign Application Priority Data

May 11, 1987 [NL] Netherlands ............... 8701110

[51] Int. Cl.[4] ............... G11C 27/00; H01L 29/76
[52] U.S. Cl. ............................ 365/183; 365/233
[58] Field of Search .......... 365/183, 189, 77, 78, 365/219, 238, 233; 357/24

[56] References Cited

U.S. PATENT DOCUMENTS 4,196,389  4/1980  Kelly et al. ............... 365/183
4,225,947  9/1980  Councill et al. ............ 365/238

Primary Examiner—Joseph A. Popek
Attorney, Agent, or Firm—Michael E. Marion

[57] ABSTRACT

A charge-coupled memory of the SPS type, in which the input of the series input register is coupled so as to be switchable to an n-bit shift register. The data can thus be read in directly or with a certain delay via the shift register. If an uninterrupted flow of bits is supplied, for example video information, a pause, during which no bits appear at the input of the input register, can be obtained by switching on the shift register in the supply of information to the input register, without information being lost. This pause can be utilized to transport information already read in to the parallel section. As a result, a matrix organization can be given to the memory, in which event the dissipation is lower, the transfer losses are smaller and at the same time a gain in surface area is obtained.

10 Claims, 4 Drawing Sheets

CHARGE-COUPLED DEVICE

BACKGROUND OF THE INVENTION

The invention relates to a charge-coupled device comprising a memory of the series-parallel-series type having a series input register and a series output register as well as a parallel section located between these registers, for each line of bits stored in the parallel section the series input register being filled n successive times with a subline of bits in such a manner that the bits of one subline are stored between the bits of another subline in the parallel section.

Charge-coupled devices of this type are described inter alia in the chapter "Interlaced SPS" on page 200 ff. of the book "Charge-Coupled Devices and Systems" of Howes and Morgan, published by John Wiley and Sons Ltd., Edition 1980. By the use of the interlacing principle, according to which each line in the parallel section is read into the series input register in the form of several sublines, which are joined in the parallel section to form a whole line, the number of parallel registers per stage of the series registers can be increased. Thus, with a given line length, the length of the series registers can be limited and hence the size of the required crystal surface area can be limited. Moreover, the number of rapid transporting steps taking place in the series registers can be limited.

A specific application of SPS memories is described inter alia in the article "A Digital Field Memory for Television Receivers" of M. J. Pelgrom et al in I.E.E.E. Transactions on Consumer Electronics, Vol. CE-29, No. 3, August 1983, p. 242/248. In the system described here, the video information is supplied in digital form, i.e. 7 bits, parallel to 7 308 kbit memories. Each memory (chip) is in turn composed of 8 SPS blocks, into which the information supplied is read in demultiplexed form. The construction of the memories is such that information (bits) of two television lines is stored in each line of each block. For transferring bits from the series input register to the parallel section, use may be made of the horizontal line fly-back time (about 12 $\mu$sec).

In general, in an SPS memory, in which the length of the series registers amounts to N bits, the clock frequency $f_p$ of the parallel section will be much higher than the clock frequency fs of the series registers, as a result of which the dissipation will take place for the major part in the series registers. For this reason, a further reduction of the length of the series registers would be desirable.

Another reason for reducing the length of the series registers may be found in a possible saving in area. The surface area occupied by the parallel section will depend essentially only upon the storage capacity and will therefore substantially not vary by shortening of the series registers. The saving in area is obtained in that the area occupied by the series registers and the associated wiring of clock lines and the like and the area occupied by the de-interlacing electrodes are reduced.

As is further known, charge losses always occur during the charge transport in charge-coupled devices. These charge losses are larger as the rate of transport increases and will therefore be largest in the series registers. This may be a third reason for reducing the length of the series registers to a minimum.

SUMMARY OF THE INVENTION

The invention has for its object to provide a series-parallel-series memory of the kind described in the opening paragraph, in which the length of the series registers can further be reduced.

A charge-coupled device according to the invention is characterized in that the series register is provided with an input stage comprising an additional memory, in which, when the series input register is filled with a first subline, at least the first bit of the next subline can be stored, while the first subline is transferred to the parallel section, after which the bits stored in the additional memory and the remaining bits of the next subline can be read into the series input register.

When the first bit(s) of the second subline is (are) stored in the additional memory, a pause is obtained in the flow of information, which can be utilized to transfer the first subline from the series input register to the parallel section. After this has happened, the second subline as a whole can be read into the input series register. As a result, the length of the series input register can be smaller, for example half of an uninterrupted flow of data to be introduced.

A preferred embodiment is characterized in that the additional memory is constituted by an N-bit shift register, of which the input is coupled to a switching device and of which the output is coupled to the input of the input register, as a result of which the information supplied can be supplied directly or via the shift register to the series input register. In this embodiment, it can be determined by merely adjusting the switch whether the flow of information is supplied directly to the input of the input register or is supplied thereto via the shift register.

BRIEF DESCRIPTION OF THE DRAWINGS

The invention will be described more fully with reference to an embodiment and the accompanying diagrammatic drawing, in which:

FIG. 7a shows a circuit diagram of one embodiment of an additional memory and switching means which can be used at the output of the device of FIG. 4.

DETAILED DESCRIPTION OF THE INVENTION

Figure 1:
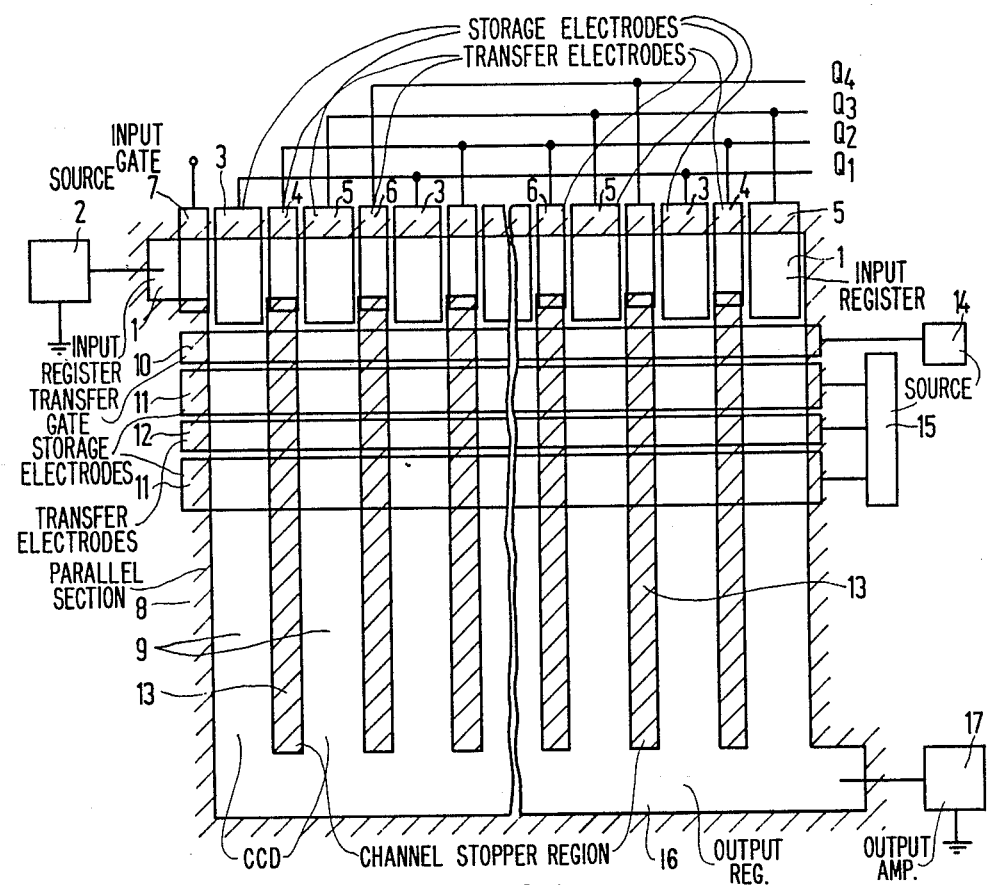
FIG. 1 shows the circuit diagram of an SPS memory.

FIG. 1 shows diagrammatically an SPS (Series-Parallel-Series) memory of the type to which the invention relates. The device comprises a series input register 1, in which the charge transport takes place from the left to the right in the plane of the drawing. The input signals are supplied via a source 2 and are transported by a 4-phase electrode system. In the drawing, the electrodes are shown beside each other for the sake of clarity, but it will be appreciated that in practical embodiments they will partly overlap each other. The electrode system comprises per stage two storage electrodes 3 and 5 and two transfer electrodes 4 and 6. The storage electrodes 4 and 6 are connected to the clocks $\phi_1$ and $\phi_3$, respectively, while the transfer electrodes 2 and 4 are connected to the clocks $\phi_2$ and $\phi_4$, respectively. One (or several) input gate(s) 7 can be arranged between the signal source 2 and the first clock electrode 5.

The series input register 1 is followed by the parallel section 8, which comprises a large number of adjacent charge-coupled devices (CCDS) 9, in which the charge transport takes place from top to bottom in the plane of the drawing. These registers are proportioned so that one parallel channel 9 corresponds to each storage electrode 3,5 in the series input register. The channels 9 are separated from each other by channel stopper regions 13, which are shown by cross-hatched lines in the drawing. Such a channel stopper region is also arranged along the periphery of the device. The parallel section 8 is provided with an electrode system which comprises from the input register first a transfer gate 10 and then a large number of storage electrodes 11 and transfer electrodes 12, of which only a few are shown in the drawing.

The transfer gate 10 is connected to a source 14, which supplies a pulse each time that the series input register 1 is full, as a result of which the signals stored below the storage electrodes 3 or 5 can flow on to the first storage electrode in the parallel section. For the remaining part of the time, the gate 10 is at a blocking voltage. The electrodes 11, 12 are connected to a source 15, with which the device may be operated, for example, in the known one-electrode/bit mode. In this connection it should be noted that the term "one electrode" is to be understood to mean any combination of transfer electrode and adjacent storage electrode, irrespective of whether they are connected to each other and are controlled by the same clock voltage or are not connected to each other and are driven separately. On the lower side the registers 9 terminate in the series output register 16, in which the charge transport again takes place from the left to the right in the plane of the drawing. The series output register 16 may be provided with an electrode system (not shown in the drawing) similar to that of the input register 1. The signals may be transported in parallel from the parallel section 8 to the output register and may be read out at the output, if desired via an output amplifier 17.

As is described in the aforementioned publication in I.E.E.E. Transactions on Consumer Electronics, Vol. CE-29, No. 3, August 1983, p. 242/248, such a memory may be used for storing video information. For considerations of speed, a multiplex system is used, in which instead of a memory comprising a single block as shown in FIG. 1 a memory comprising a large number of SPS blocks is used. The seven bit digital video information is first demultiplexed per bit and is then supplied to the SPS blocks and is multiplexed again during reading. This multiplex operation is not essential to the invention. For the following description, the memory will be considered as being composed of only one SPS block. Therefore, it should always be kept in mind that in fact a multiplex may be concerned.

Figure 2:
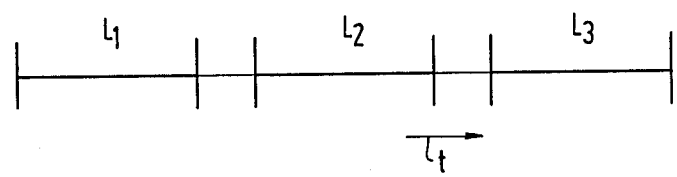
FIG. 2 shows a diagram of information supplied as a function of the time t.

FIG. 2 shows diagrammatically video information as a function of the time t of a number of successive video lines. Each line period lasts 64 $\mu$sec, divided into a period of 52 $\mu$sec with active information (indicated in the drawing by a fat line between two vertical lines) and a horizontal fly-back time of 12 $\mu$sec (indicated by a thin line).

Figure 3:
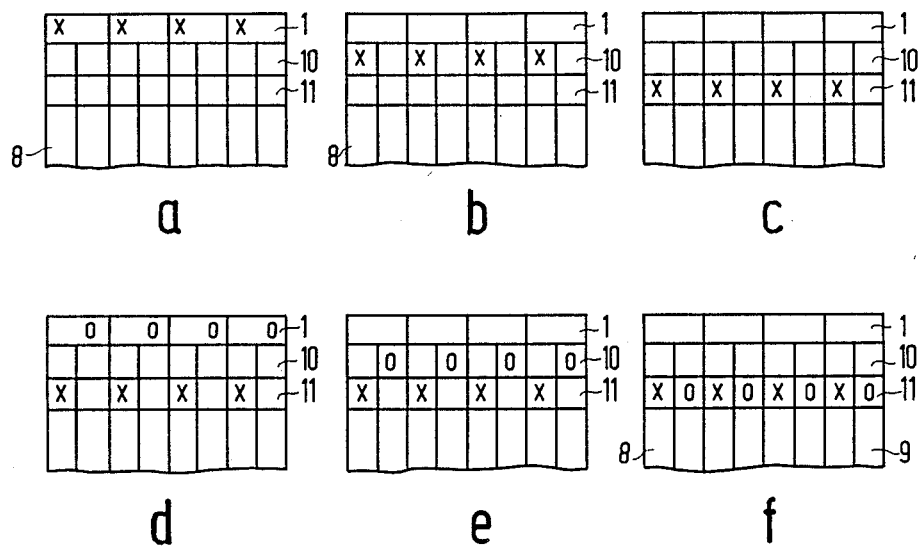
FIG. 3 (a to c) shows a diagrammatic representation of the supply of information to the parallel section by means of the interlacing method.

Since per stage of the series register there are two parallel channels 9, the information must be supplied by means of the known interlacing method. For explanation of this method, FIG. 3 shows diagrammatically a part of the series input register 1 (with four bits) and an adjoining part of the parallel section 8 with the transfer electrode 10 and the first storage gate 11 at six different instants. FIG. 3a shows the situation in which the series register 1 is entirely filled, for example with information of $L_1$. Each stage of the series register comprises one bit indicated by a cross of the line L. FIGS. 3b and 3c show how this information is transferred to the parallel channels 9. It appears from FIG. 3c that only half of the storage sites in a line are occupied. For transporting the charge from the input register 1 to the parallel section 8, use may be made of the horizontal flyback time. The series register 1 may then be filled again with information from the line $L_2$ (FIG. 3d). This information indicated by zeros is then transported in the parallel section to the empty sites between the crosses (FIG. 3f). The whole line is then full and can be transported in known manner through the parallel section and can be divided again at the series output register 16 into the two lines $L_1$ and $L_2$, which are read out sequentially via the series output register 16. This operation of dividing the line of bits into two lines is also described in the chapter "Interlaced SPS" in the aforementioned book of Howes and Morgan.

Because of saving in space and since due to the lower clock frequency the dissipation in the parallel section is much lower than in the series registers, it is desirable to make the length of the series registers as small as possible.

Figure 4:
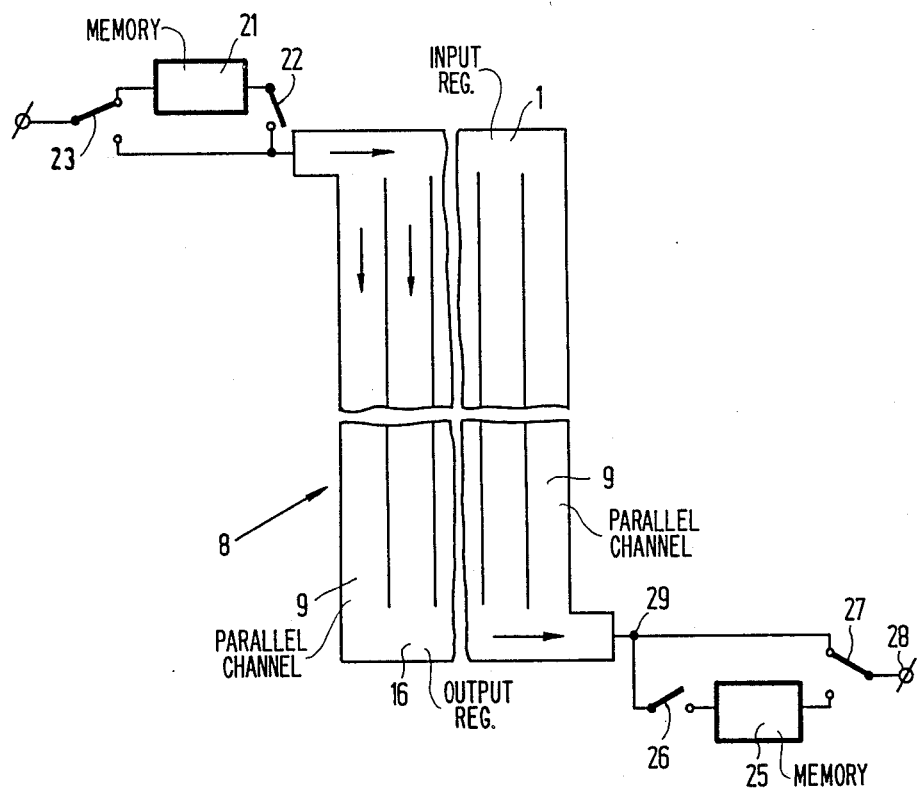
FIG. 4 shows the circuit diagram of an SPS memory according to the invention.

FIG. 4 shows diagrammatically an SPS memory according to the invention, in which this is achieved in that the number of parallel registers 9 is halved.

This Figure shows diagrammatically the SPS memory with the series input register 1, the series output register 16 and the parallel section 8. In this drawing, the electrodes are entirely omitted for the sake of clarity. The length of the series registers 1 and 16 and hence the width of the parallel section are assumed now to be half those in the embodiment of FIG. 1. The length of the parallel section is assumed to be twice that in FIG. 1 so that the storage capacity does not vary. The gain in space is obtained by the smaller surface area occupied by the series registers with the associated wiring and by the de-interlacing part at the transition from parallel to series. The input of the memory comprises an additional memory 21, which is connected to the input via switching means 22. The input of the SPS memory is further connected via switching means 23 to the signal source 2 (not shown here). During operation, the input of the SPS memory is first directly connected to the signal source. The first half of a television line can then be read into the series input register 1. The series input register 1 is then full and the written bits an be transferred to the parallel section 8 in the manner described hereinbefore. Due to the fact that the pause in the flow of information during the horizontal line fly-back time is not utilized, the flow of information continues. The bits that would have had to be read into the register 1 are not lost, but can be introduced into the additional memory 21 by changing over the switch 23. When the series register 1 is empty again, the second half of the line can be read as a whole into the series register 1.

Figure 5:
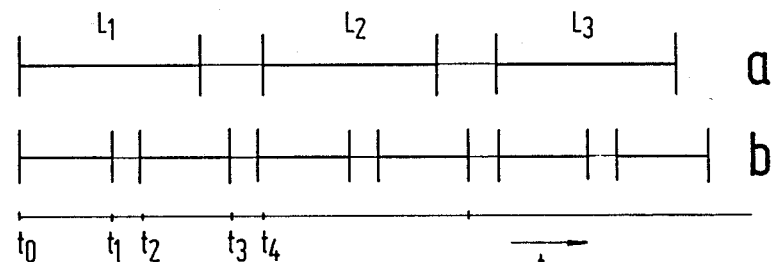
FIG. 5 shows a diagram of the supplied information as a function of the time t in the device shown in FIG. 4.

Although all kinds of memories may be used, preferably an n-bit shift memory is used for the additional memory 21, n being larger than or equal to 1. The principle of the operation is shown in FIGS. 5a and b. In this drawing, FIG. 5a again shows the line information of a television picture as a function of the time t analogous to FIG. 2.

In the time interval $t_o-t_1$, the switches 22, 23 are adjusted so that the information supplied can directly be read into the series register 1. At $t_1$ this register is full and the switches 22,23 are changed over, as a result of which the information supplied of $L_1$ is read in via the shift register 21. The first bits of the second half of $L_1$ appear only at $t_2$ at the output of the shift register 21 so that there is a pause between $t_1$ and $t_2$ at the input of the series register 1, in which no data are supplied. This pause between $t_1$ and $t_2$ can be used to transfer the data read in from the first half of $L_1$ to the parallel section 8. At the time interval $t_2-t_3$, the second half of the television line $L_1$—delayed by the shift register 21—is read in by the series input register 1. At $t_3$ the input register 1 is full. Since this instant lies in the horizontal fly-back time in which no new active information is supplied, it is possible to transfer without loss of information the second half of the television line $L_1$ from the input register 1 to the parallel section 8 between the bits already stored there of the first half of $L_1$. Between $t_3$ and $t_4$, the switches 22,23 can be changed over, as a result of which the data of the first half of the television line $L_2$ can again be directly read in by the input register 1.

Figure 6:
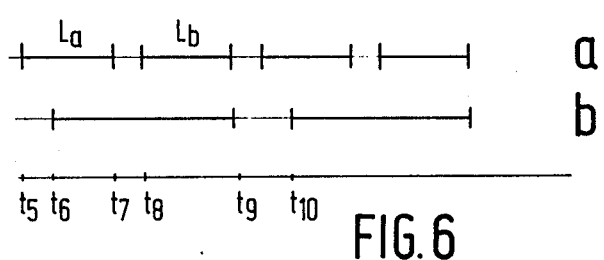
FIG. 6 shows a diagram of the information read out at the input of the device shown in FIG. 4 as a function of the time t.

For reading out, the two halves of $L_1$ must be separated again; first the first half of $L_1$ and then, when the output register 16 is empty again, the second half of television line $L_1$ is introduced into the series output register 16 and is transported to the output 29. The two halves of $L_1$ can then appear at the output 29 with a pause. In FIG. 6 this is illustrated again by a time diagram. $L_a$ and $L_b$ represent the two halves of the data of one television line appearing at the output 29. Between $t_7$ and $t_8$, a censure occurs in the flow of information, which is often undesirable in connection with the further signal processing. This censure can be eliminated by means of a delay circuit similar to that used at the input. As is shown diagrammatically in FIG. 4, the output also comprises a memory 25 in the form of a delay line, which can be connected through the switches 26,27 to the output 24 and the output terminal 28, respectively. Through the switch 27, the output terminal 28 may also be directly connected to the output 29 of the output register 16. The principle of the operation explained also with reference to FIG. 6 is as follows. If at $t_5$ the first bit of the second line half appears at the output 29, the point 29 is connected through the switch 26 to the register 25, while the output terminal 28 is connected to the output of the register 25. The first half $L_a$ consequently arrives at the output terminal 28 with a certain delay with respect to the point 29. At the instant $t_7$, the last bit arrives at the point 29, while at $t_8$ (or just before $t_8$) it arrives at the output terminal 28. The switches 26 and 27 are then changed over, as a result of which the output terminal 28 for the second line half $L_b$ is directly connected to the output 29. The data of $L_b$ arrive without delay at the output terminal 28 so that between $t_5$ and $t_9$ a whole line can be read out without interruption at the output terminal 28. When the whole line has been read out at $t_9$, the register 25 can be switched on again for the next line so that the following data arrive again with a certain delay at the terminal 28 and are separated from the preceding line by a time interval $t_9-t_{10}$, which corresponds to the horizontal line fly-back time.

Figure 7A:
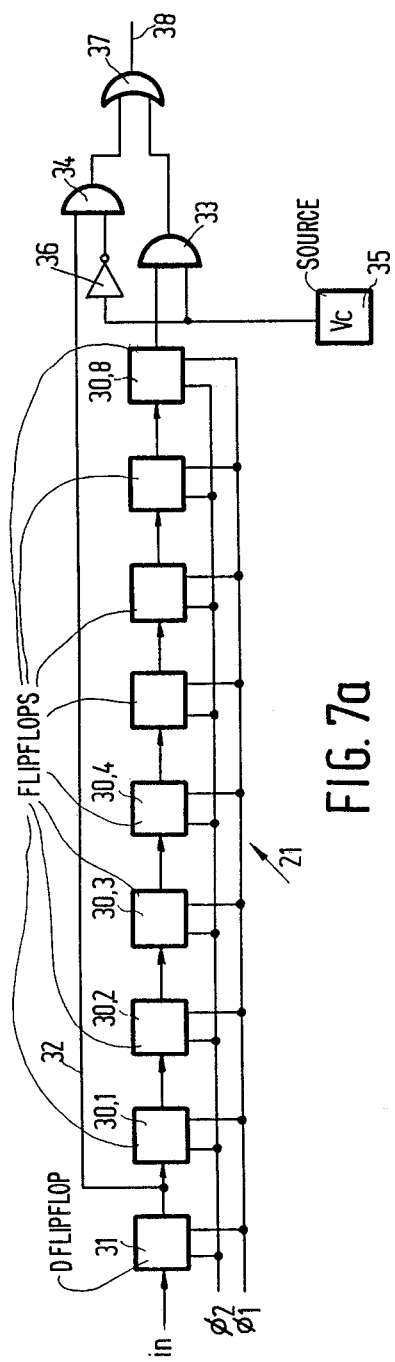
FIG. 7a shows a circuit diagram of one embodiment of an additional memory and switching means which can be used at the input of the device of FIG. 4.

FIG. 7a shows a possible embodiment of the register 21. The circuit comprises an 8-bit shift register with eight stages each having a D flipflop, which are provided, in order to distinguish them from each other, with the reference numerals 30,1; 30,2; 30,3; etc. As described below, the switching performed by switching means 22, 23 in FIG. 4 is performed in the embodiment of FIG. 7a by voltage source 35, inverter 36 and AND-gates 34, 33. These components determine whether the output signal 38 is provided by the input signal directly though line 32 or by the delayed line of flip-flops 30, 1 through 30,8. A D flipflop 31 is further arranged in front of the first flipflop 30,1 of the memory. This additional stage serves only to synchronize the input signals supplied via the input with the clocks. The signals introduced can be transported by means of the clocks $\phi_1$, $\phi_2$ to the output of the last flipflop 30,8 or can be directly processed further via the connection 32. The output of the register 21 comprises two AND gates 33 and 34. The direct connection 32 is connected to an input of the gate 34, while the last stage 30,8 is connected to an input of the AND gate 33. It is determined by means of the clock Vc delivered by the source 35 and directly supplied to the gate 33 and, after inversion by the inverter stage 36, to the gate 34, which of the gates 33 and 34 transmits the signals supplied. The outputs of the gates 33 and 34 are connected to the inputs of the OR gate 37, at whose output 38 the signals will be derived with or without delay. If during operation Vc=1, the output of the gate 34=0. The output of the gate 33 follows the signals supplied by the last flipflop 30,8 of the register 21. If Vc=0, the gate 33 is closed and the signals passed via the connection 32 to the gate 34 are transmitted. The delayed or non-delayed signals can be derived at the output 38 and may be read in, if desired, by the input register of the SPS memory after demultiplexing.

Figure 7B:
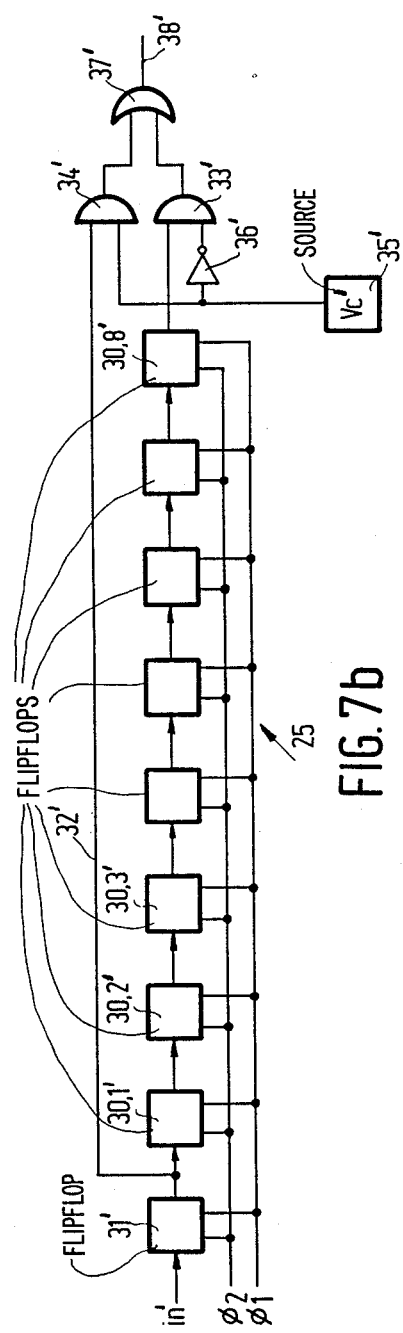

The register 25 at the output of the memory may be composed in the same manner as the register 21. FIG. 7b shows the circuit diagram of the register 25, in which for corresponding parts the same reference numerals are used as for the register 21 in FIG. 7a, but now provided with an accent. The output signals of the SPS memory are supplied, as the case may be after multiplexing, to the input of the flipflop 31' and/or are passed without delay via the connection 32' to the output terminal 38' of the OR gate 37' (which is identical to the output terminal 28 in FIG. 4) or with a certain delay via the register 25 to the output 38'. In this case, a control signal Vc supplied by the source 35', which is of the same shape, but, if desired, is shifted in phase with respect to the signal Vc, may be used for the register 21 on the understanding that the signal Vc is now supplied in inverted form to the gate 33'.

It will be appreciated that the invention is not limited to the embodiment described here, but that within the scope of the invention many variations are possible for those skilled in the art. For example, a picture line may be supplied instead of in two parts also in three parts to the series input register 1. The interlacing procedure must then be carried out two times in succession, which is possible, for example, by connecting in cascade arrangement a number of memories or shift registers 21 with the required switches 22,23. A similar cascade arrangement may be provided at the output in order to ensure that all bits have the same delay time.

The SPS memory may also be composed of buried channel CCD's or of bucket brigade registers.

What is claimed is:

1. A charge-coupled device comprising a memory of the series-parallel-series type having a series input register and a series output register as well as a parallel section located between these registers, characterized in that the series input register is provided with an input stage comprising an additional memory, in which, when the series input register is filled with a first subline comprising a plurality of bits, at least the first bit of a second subline comprising a plurality of bits can be stored, while the bits of the first subline are transferred to the parallel section, after which the bits of said second subline are stored in the additional memory and the remaining bits of the second subline can be read into the series input register.

2. A charge-coupled device as claimed in claim 1, characterized in that the additional memory is constituted by a shift register having an input coupled to a switching device and an output coupled to the input of the series input register, as a result of which said first and second sublines are supplied directly or via the shift register to the series input register.

3. A charge-coupled device as claimed in claim 2, characterized in that the shift register is constituted by a digital shift register.

4. A charge-coupled device as claimed in claim 3, characterized in that the device is intended for storing picture information by display arrangements, for example television, the number of bits per line in the parallel section corresponding to at most the number of pixels of a single line of the display arrangement.

5. A charge-coupled device as claimed in claim 3, in which said first and second sublines are transported from said parallel section to said series output register and are read out in succession, characterized in that the output of the series output register is coupled to a second additional memory and to switching means for compensating for at least part of any difference in delay time between said first and second sublines.

6. A charge-coupled device as claimed in claim 2, characterized in that the device is intended for storing picture information by display arrangements, for example television, the number of bits per line in the parallel section corresponding to at most the number of pixels of a single line of the display arrangement.

7. A charge-coupled device as claimed in claim 2, in which said first and second sublines are transported from said parallel section to said series output register and are read out in succession, characterized in that the output of the series output register is coupled to a second additional memory and to switching means for compensating for at least part of any difference in delay time between said first and second sublines.

8. A charge-coupled device as claimed in claim 1 characterized in that the device is intended for storing picture information by display arrangements, for example television, the number of bits per line in the parallel section corresponding to at most the number of pixels of a single line of the display arrangement.

9. A charge-coupled device as claimed in claim 8, in which said first and second sublines are transported from said parallel section to said series output register and are read out in succession, characterized in that the output of the series output register is coupled to a second additional memory and to switching means for compensating for at least part of any difference in delay time between said first and second sublines.

10. A charge-coupled device as claimed in claim 1, in which said first and second sublines are transported from said parallel section to said series output register and are read out in succession, characterized in that the output of the series output register is coupled to a second additional memory and to switching means for compensating for at least part of any difference in delay time between said first and second sublines.

* * * * *